(12) United States Patent
Chen et al.

(10) Patent No.: US 8,629,029 B2
(45) Date of Patent: Jan. 14, 2014

(54) VERTICAL SOI BIPOLAR JUNCTION TRANSISTOR AND MANUFACTURING METHOD THEREOF

(75) Inventors: Jing Chen, Shanghai (CN); Jiexin Luo, Shanghai (CN); Qingqing Wu, Shanghai (CN); Jianhua Zhou, Shanghai (CN); Xiaolu Huang, Shanghai (CN); Xi Wang, Shanghai (CN)

(73) Assignee: Shanghai Institute of Microsystem and Information Technology, Chinese Academy of Sciences, Changning District, Sanghai (CN)

( * ) Notice: Subject to any disclaimer, the term of this patent is extended or adjusted under 35 U.S.C. 154(b) by 385 days.

(21) Appl. No.: 13/055,577

(22) PCT Filed: Jul. 14, 2010

(86) PCT No.: PCT/CN2010/075156
§ 371 (c)(1),
(2), (4) Date: Jan. 24, 2011

(87) PCT Pub. No.: WO2011/072527
PCT Pub. Date: Jun. 23, 2011

(65) Prior Publication Data
US 2011/0233727 A1    Sep. 29, 2011

(30) Foreign Application Priority Data

Dec. 17, 2009 (CN) .......................... 2009 1 0201332

(51) Int. Cl.
*H01L 21/331*    (2006.01)
(52) U.S. Cl.
USPC ................... 438/311; 257/565; 257/E21.372; 257/E21.375

(58) Field of Classification Search
USPC ........................... 257/565, 578, 586; 438/311
See application file for complete search history.

(56) References Cited

U.S. PATENT DOCUMENTS

| | | | |
|---|---|---|---|
| 6,849,871 B2 * | 2/2005 | Ning | 257/47 |
| 6,949,764 B2 * | 9/2005 | Ning | 257/47 |
| 2010/0163872 A1 * | 7/2010 | Lim | 257/49 |

* cited by examiner

*Primary Examiner* — Ha Tran T Nguyen
*Assistant Examiner* — Raj R Gupta
(74) *Attorney, Agent, or Firm* — Global IP Services; Tianhua Gu

(57) ABSTRACT

The present invention discloses a vertical SOI bipolar junction transistor and a manufacturing method thereof. The bipolar junction transistor includes an SOI substrate from down to up including a body region, a buried oxide layer and a top silicon film; an active region located in the top silicon film formed by STI process; a collector region located in the active region deep close to the buried oxide layer formed by ion implantation; a base region located in the active region deep close to the top silicon film formed by ion implantation; an emitter and a base electrode both located over the base region; a side-wall spacer located around the emitter and the base electrode. The present invention utilizing a simple double poly silicon technology not only can improve the performance of the transistor, but also can reduce the area of the active region in order to increase the integration density. Furthermore, the present invention utilizes side-wall spacer process to improve the compatibility of SOI BJT and SOI CMOS, which simplifies the SOI BiCMOS process and thus reduce the cost.

7 Claims, 4 Drawing Sheets

VERTICAL SOI BIPOLAR JUNCTION TRANSISTOR AND MANUFACTURING METHOD THEREOF

CROSS REFERENCE TO RELATED PATENT APPLICATION

The present application is the US national stage of PCT/CN2010/075156 filed on Jul. 14, 2010, which claims the priority of the Chinese patent application No. 200910201332.5filed on Dec. 17, 2009, which application is incorporated herein by reference.

FIELD OF THE INVENTION

The present invention relates to the microelectronics and solid state electronics fields and more particularly to a vertical silicon-on-insulator (SOI) bipolar junction transistor (BJT) and a manufacturing method thereof.

BACKGROUND OF THE INVENTION

Owing to the rapid development of the mobile communication industry, the demand for radio frequency integrated circuits (RFIC) has increased tremendously and the RFIC technology filed is getting very competitive. BiCMOS, refers to the integration of bipolar junction transistors and CMOS technology into a single integrated circuit device, is widely used and has been quiet successful in the RFIC technology filed with high density and the advantages both of BJT and CMOS. As CMOS adopts the thin silicon-on-insulator (SOI) substrate for lower power and higher speed, SOI BiCOMS has caught worldwide attention.

In order to facilitate integration with SOI CMOS, lateral SOI BJTs have been proposed and studied. Even though lateral SOI BJT devices are easier to be integrated with SOI CMOS, the performance of such devices is limited. This is because the base width in the lateral SOI BJT is determined by lithography. However, the base width has a direct effect on transistor gain, thereby influencing the DC characteristics of the transistor. On the other hand, the carrier transit time is directly related to the base width, and the transistor cutoff frequency varies inversely as carrier transit time, therefore the base width has a great impact on frequency characteristic of the transistor. In a word, the base width has great influence on the transistor characteristics, and the lateral SOI BJT devices cannot be easily scaled down.

Compared with the lateral SOI BJT, a vertical SOI BJT is another type of SOI BJT. In the conventional vertical SOI BJT, the bulk silicon BJT technology is applied to SOI substrate, thereby such a BJT is unsuitable for the integration with high-performance SOI CMOS. There are two problems: On the one hand, the shallow trench isolation technology is very complicated and thereby increases the integration cost; On the other hand, the extraction electrode with ohmic contact formed by high dose rate ion implantation raises the area, and thereby lower the density of integration. At present, there is a new type of SOI BJT, which adopts back gate-induced, minority carrier inversion layer as collector. Although it can improve the integration of SOI BJT and high-performance SOI CMOS, for a typical SOI substrate, a substrate bias of 30 V is required in order to pass through the back-gate and form inversion layer in the body region of SOI. Such a high bias is not compatible with conventional SOI CMOS techniques, thus the buried oxide layer of the SOI BJT active region has to be thinned and a graphical SOI substrate is required. However, there are two problems adopting the graphical SOI substrate: (1) it is hard to be aligned in photolithography; (2) it makes the SOI BJT manufacturing process more complicated.

SUMMARY OF THE INVENTION

The present invention provides a vertical SOI bipolar junction transistor with high integration density and good compatibility and a manufacturing method thereof.

Accordingly, the present invention provides a vertical SOI bipolar junction transistor comprising:

an SOI substrate from down to up including a body region, a buried oxide layer and a top silicon film;

an active region located in the top silicon film formed by shallow trench isolation process of integrated circuit;

a collector region located in the active region deep close to the buried oxide layer formed by ion implantation;

a base region located in the active region deep close to the top silicon film formed by ion implantation;

an emitter and a base electrode both located over the base region;

a side-wall spacer located around the emitter and the base electrode.

Preferably, said active region is isolated by a shallow trench isolation region.

Preferably, a shallow emitter junction is provided formed by impurities diffusing from the emitter to the base region.

A method of manufacturing a vertical SOI bipolar junction transistor comprises steps of:

(a) according to priority growing a body region, a buried oxide layer and a top silicon film from down to up to form an SOI substrate;

(b) forming an active region in the top silicon film via shallow trench isolation process of integrated circuit;

(c) forming a collector region and a base region in the active region by ion implantation;

(d) preparing a poly silicon layer on the top silicon film by chemical vapor deposition, and creating a mask;

(e) forming a pattern in positive photoresist via the mask and doping the poly silicon layer twice by ion implantation, then forming an another pattern in negative photoresist via the mask so as to create two poly silicon structures which are a poly silicon emitter and a poly silicon base electrode respectively;

(f) annealing, so as to drive impurities diffusing from the poly silicon emitter to the base region to form a shallow emitter junction;

(g) creating a side-wall spacer to isolate the poly silicon emitter and the poly silicon base electrode.

Preferably, said collector region is formed by implanting N-type impurity into the active region deep close to the buried oxide layer.

Preferably, said base region is formed by implanting P-type impurity into the active region deep close to the top silicon film.

Preferably, said implanting of N-type impurity is a retrograde doping process which has a deep implantation before a shallow implantation. Said implanting of P-type impurity is a retrograde doping process which has a deep implantation before a shallow implantation.

Preferably, said poly silicon emitter is formed by n+ heavily doping and etching.

Preferably, poly silicon base electrode is formed by p+ heavily doping as a outlet of the base region.

| 1 | body region, |
| 2 | buried oxide layer |
| 3 | top silicon film |
| 4 | shallow trench isolation region |
| 5 | collector region |
| 6 | base region |
| 7 | emitter |
| 8 | base electrode |
| 9 | shallow emitter junction |
| 10 | side-wall spacer |
| 11 | collector electrode |

DETAILED DESCRIPTION OF THE INVENTION

The present invention is further explained in detail according to the accompanying drawings.

First Embodiment

The present invention relates to a vertical silicon-on-insulator (SOI) bipolar junction transistor (BJT) and a method for manufacturing thereof. Such a vertical SOI BJT realizes a simple double poly silicon technology on SOI. One poly silicon structure means n+ poly silicon emitter which is used for reducing surface recombination velocity of the emitter, so as to improve the emitter injection efficiency and increase the current gain; on the other hand, the impurities in n+ poly silicon emitter can diffuse and form shallow emitter junction. Another poly silicon structure means p+ poly silicon base electrode as a outlet of the base region which can reduce the effective area of the device. According the present invention, the isolation between emitter and base electrode and the isolation between emitter and collector electrode utilize side-wall spacer process in MOS integrated circuit instead normal shallow trench isolation process, which can realize self-alignment, reduce the use of photolithography mask and have good compatibility with SOI CMOS process, so as to reduce the cost.

Figure 1:
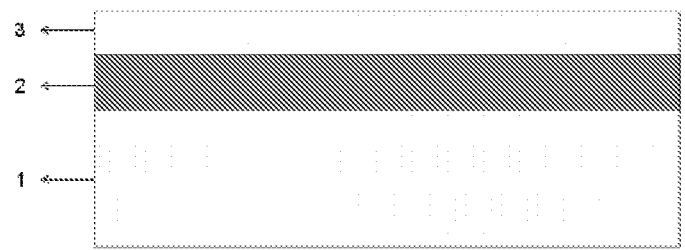
FIG. 1 shows a cross-schematic view of an SOI substrate structure.
Figure 2:
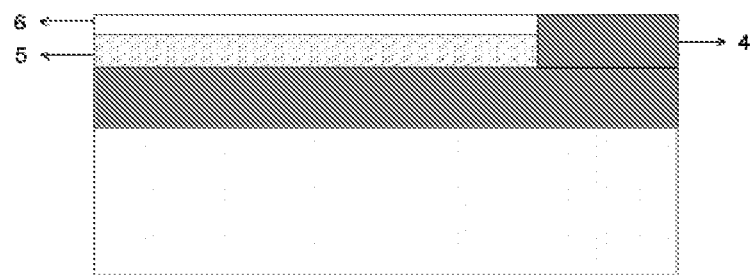
FIG. 2 shows a cross-schematic view of an active region of the transistor according to the present invention.
Figure 3:
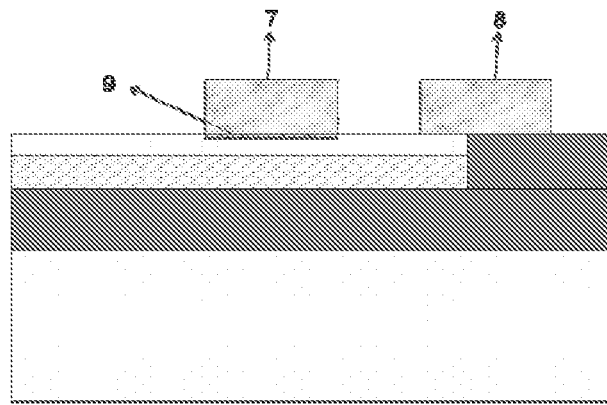
FIG. 3 shows a cross-sectional view of two poly silicon structures according to the present invention.
Figure 4:
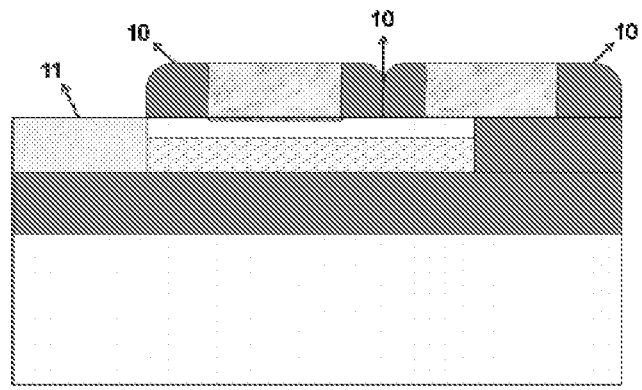
FIG. 4 shows a cross-sectional view of a side-wall spacer according to the present invention.

Referring to FIG. 1-FIG. 4 of the drawings, the present embodiment provides a vertical SOI bipolar junction transistor comprising: an SOI substrate from down to up including a body region 1, a buried oxide layer 2 and a top silicon film 3; an active region located in the top silicon film formed by shallow trench isolation(STI) process of integrated circuit; a collector region 5 located in the active region deep close to the buried oxide layer formed by ion implantation; a base region 6 located in the active region deep close to the top silicon film formed by ion implantation; an emitter 7 and a base electrode 8 both located over the base region; a side-wall spacer 10 located around the emitter and the base electrode. Said active region is isolated by a shallow trench isolation region 4. A shallow emitter junction 9 is provided formed by diffusion from the emitter to the base region. The side-wall spacer 10 is used for isolating the poly silicon structures and a collector electrode 11.

A method of manufacturing a vertical SOI bipolar junction transistor comprises steps of:

(a) according to priority growing a body region, a buried oxide layer and a top silicon film from down to up forming an SOI substrate;

(b) forming an active region in the top silicon film via STI process of integrated circuit;

(c) forming a collector region and a base region in the active region by ion implantation;

(d) preparing a poly silicon layer on the top silicon film by chemical vapor deposition, and creating a mask;

(e) forming a pattern in positive photoresist via the mask and doping the poly silicon layer twice by ion implantation, then forming an another pattern in negative photoresist via the mask so as to create two poly silicon structures which are a poly silicon emitter and a poly silicon base electrode respectively;

(f) annealing, so as to drive impurities diffusing from the poly silicon emitter to the base region to form a shallow emitter junction;

(g) creating a side-wall spacer to isolate the poly silicon emitter and the poly silicon base electrode.

Wherein, said collector region is formed by implanting N-type impurity into the active region deep close to the buried oxide layer. Said base region is formed by implanting P-type impurity into the active region deep close to the top silicon film. Said implanting of N-type impurity and P-type impurity is a retrograde doping process which has a deep implantation before a shallow implantation. Said poly silicon emitter is formed by n+ heavily doping and etching. And said poly silicon base electrode is formed by p+ heavily doping as a outlet of the base region.

Figure 5:
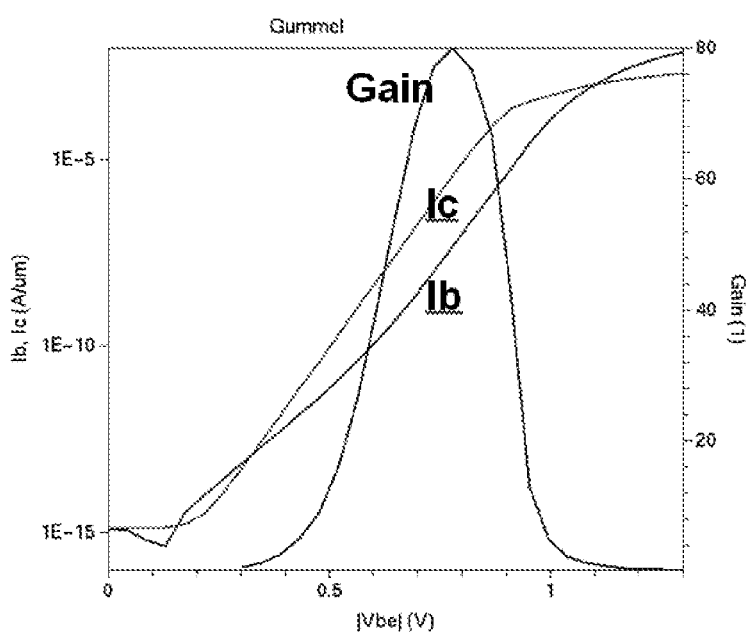
FIG. 5 illustrates the DC characteristics with Gummel plots according to the present invention.
Figure 6:
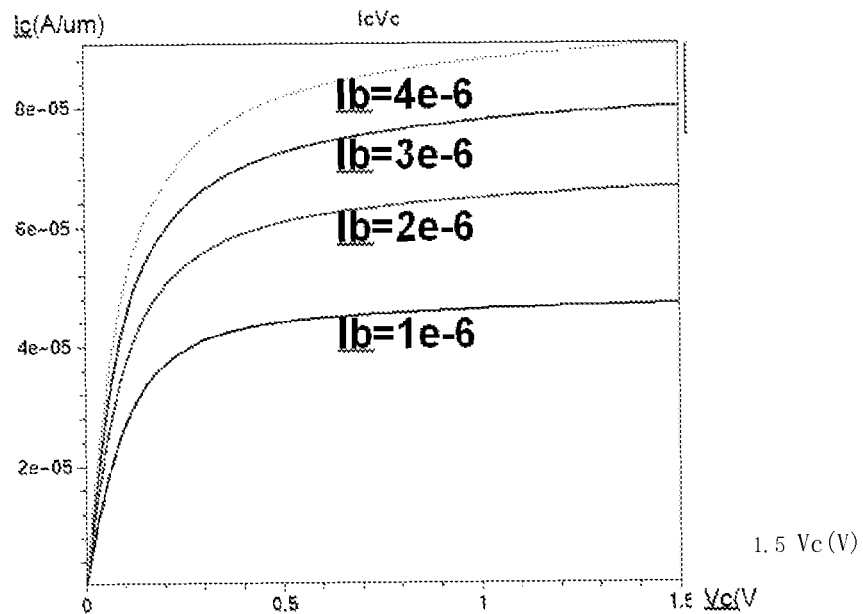
FIG. 6 illustrates the DC characteristics with Ic-Vc plots according to the present invention.
Figure 7:
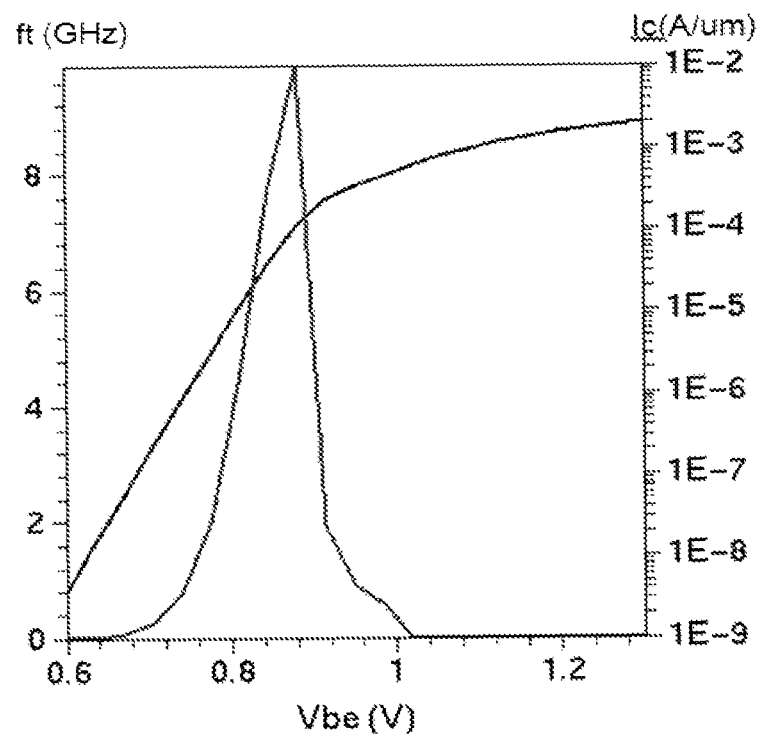
FIG. 7 illustrates the RF characteristics with cut-off frequency according to the present invention.
Figure 8:
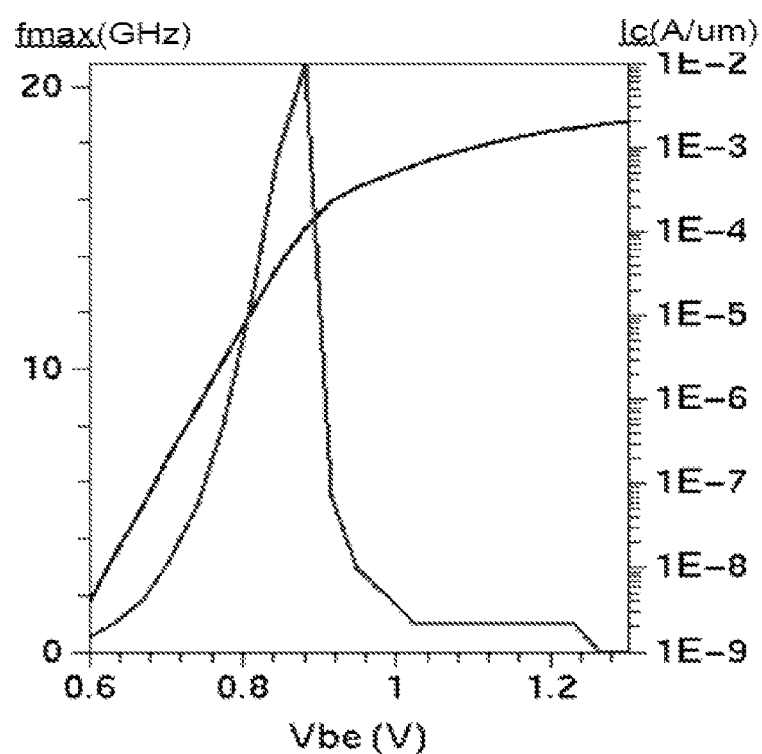
FIG. 8 illustrates the RF characteristics with the maximum oscillation frequency according to the present invention.

FIG. 5-FIG. 8 illustrate the DC characteristics and the RF characteristics according to the present invention.

Second Embodiment

The present embodiment provides a NPN type double poly silicon vertical SOI bipolar junction transistor with side-wall spacer and the method for manufacturing thereof.

The manufacturing method is as follow:

First, form a SOI BJT active region on an SOI substrate by STI process of integrated circuit.

Next, a collector region and a base region located in the active region are formed by ion implantation. Wherein, the collector region is formed by doping N-type impurity into the active region with ion implantation process, the doping deep close to the SOI BOX. The base region is formed by implanting P-type impurity into the active region deep close to the surface. The forming of the collector region and the base region adopts a retrograde doping process which has a deep implantation before a shallow implantation. The retrograde doping process can obtain a thinner base region, so as to increase the current gain of transistor, on the other hand, the doping dose of the collector region is higher the base region, in order to increase the collection coefficient of the collector region and increase the current gain of transistor.

Next, fabricate a double poly silicon structure. First, a poly silicon layer is prepared on the top silicon film by chemical vapor deposition (CVD), and then a mask is created. The poly silicon layer is doped twice by ion implantation with positive photoresist, wherein an emitter region is formed by n+ heavily doping via a window at the emitter position, which is the first poly silicon region, and a outlet of the base region is formed by p+ heavily doping via a window at the base electrode position. Then two poly silicon structures are formed with negative photoresist by etching.

The poly silicon technology not only has good compatibility with poly silicon gate process in SOI CMOS, but also can improve the implanting efficiency of the emitter region, reduce the device effective area and increase the integration density. After such doping, a shallow emitter junction is formed by annealing so as to drive impurities diffusing from the poly silicon emitter to the base region.

After the double poly silicon structures are finished, a side-wall spacer is created to isolate the poly silicon emitter and the poly silicon base electrode. First, a $SiO_2$ layer with a special thickness isotropic grows on the SOI substrate. Then the $SiO_2$ layer with same thickness is etched in the anisotropic case.

The above description of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A method of manufacturing a vertical SOI bipolar junction transistor comprises steps of:
   (a) according to priority growing a body region, a buried oxide layer and a top silicon film from down to up forming an SOI substrate;
   (b) forming an active region in the top silicon film via shallow trench isolation process of integrated circuit;
   (c) forming a collector region and a base region in the active region by ion implantation;
   (d) preparing a poly silicon layer on the top silicon film by chemical vapor deposition, and creating a mask;
   (e) forming a pattern in positive photoresist via the mask and doping the poly silicon layer twice by ion implantation, then forming an another pattern in negative photoresist via the mask so as to create two poly silicon structures which are a poly silicon emitter and a poly silicon base electrode respectively;
   (f) annealing, so as to drive impurities diffusing from the poly silicon emitter to the base region to form a shallow emitter junction;
   (g) creating a side-wall spacer to isolate the poly silicon emitter and the poly silicon base electrode.

2. The method of manufacturing a vertical SOI bipolar junction transistor of claim 1 wherein said poly silicon emitter is formed by n+ heavily doping and etching.

3. The method of manufacturing a vertical SOI bipolar junction transistor of claim 1 wherein poly silicon base electrode is formed by p+ heavily doping as an outlet of the base region.

4. The method of manufacturing a vertical SOI bipolar junction transistor of claim 1 wherein said collector region is formed by implanting N-type impurity into the active region deep close to the buried oxide layer.

5. The method of manufacturing a vertical SOI bipolar junction transistor of claim 2 wherein said implanting of N-type impurity is a retrograde doping process which has a deep implantation before a shallow implantation.

6. The method of manufacturing a vertical SOI bipolar junction transistor of claim 1 wherein said base region is formed by implanting P-type impurity into the active region deep close to the top silicon film.

7. The method of manufacturing a vertical SOI bipolar junction transistor of claim 6 wherein said implanting of P-type impurity is a retrograde doping process which has a deep implantation before a shallow implantation.

\* \* \* \* \*